United States Patent [19]
Shibano

[11] Patent Number: 5,612,494
[45] Date of Patent: Mar. 18, 1997

[54] CAPACITANCE-TYPE ELECTROSTATIC SERVO ACCELERATION SENSOR

[75] Inventor: Tomio Shibano, Yokohama, Japan

[73] Assignee: Murata Manufacturing Co., Ltd., Japan

[21] Appl. No.: 575,884

[22] Filed: Dec. 20, 1995

[30] Foreign Application Priority Data

Dec. 22, 1994 [JP] Japan .................................. 6-320860

[51] Int. Cl.$^6$ .................................................. G01D 15/125
[52] U.S. Cl. ..................................... 73/514.32; 73/514.18
[58] Field of Search ............................ 73/514.32, 514.18, 73/862.626, 862.61; 361/280, 283.3

[56] References Cited

U.S. PATENT DOCUMENTS

| | | | |
|---|---|---|---|
| 3,911,738 | 10/1975 | Fisher | 73/141 |
| 4,009,607 | 3/1977 | Ficken | 73/141 R |
| 4,102,202 | 7/1978 | Ferriss | 73/514.18 |
| 4,345,474 | 8/1982 | Deval | 73/514.18 |
| 4,584,885 | 4/1986 | Cadwell | 73/862.61 |
| 4,932,261 | 6/1990 | Henrion | 73/514.18 |
| 5,122,755 | 6/1992 | Nootbaar et al. | 324/678 |
| 5,277,053 | 1/1994 | McLane et al. | 73/10 |
| 5,325,065 | 6/1994 | Bennett et al. | 324/661 |
| 5,343,766 | 9/1994 | Lee | 73/862.61 |
| 5,428,352 | 6/1995 | Bennett | 340/870.37 |
| 5,440,939 | 8/1995 | Barney et al. | 73/862.61 |
| 5,454,266 | 10/1995 | Chevroulet et al. | 73/514.18 |
| 5,465,604 | 11/1995 | Sherman | 73/1 DV |
| 5,473,946 | 12/1995 | Wyse et al. | 73/514.18 |
| 5,511,420 | 4/1996 | Zhao et al. | 73/514.18 |

Primary Examiner—Hezron E. Williams
Assistant Examiner—Richard A. Moller
Attorney, Agent, or Firm—Ostrolenk, Faber, Gerb & Soffen, LLP

[57] ABSTRACT

A capacitance-type electrostatic servo acceleration sensor capable of detecting applied acceleration with high sensitivity and with low error without needing an accurate oscillator. The sensor makes use of a PAM (pulse amplitude-modulation) circuit for performing pulse amplitude-modulation in proportion to the acceleration. The sensor is equipped with a capacitance-detecting portion having a movable electrode and a pair of fixed electrodes located on opposite sides of the movable electrode. The movable electrode is displaced in response to the acceleration. A comparator is formed by an operational amplifier, and a servomechanism is formed. The electrically obtained open gain of this operational amplifier is set sufficiently greater than the mechanically obtained gain of the capacitance-detecting portion. A measurement mode period and a force-balanced mode period are repeated alternately. During the measurement mode period, the movable electrode is not constrained by the servomechanism, and a voltage corresponding to the acceleration is applied to a sample-and-hold amplifier. During the force-balanced mode period, the movable electrode is constrained by the servomechanism according to the output from the sample-and-hold amplifier which corresponds to the acceleration, and the movable electrode is short-circuited to ground.

7 Claims, 3 Drawing Sheets

CAPACITANCE-TYPE ELECTROSTATIC SERVO ACCELERATION SENSOR

BACKGROUND OF THE INVENTION

1. Field of the Invention

The present invention relates to a capacitance-type electrostatic servo acceleration sensor and, more particularly, to a capacitance-type electrostatic servo acceleration sensor capable of detecting acceleration with high sensitivity and high accuracy. This sensor is especially adapted for detection of acceleration, pressure, displacement, flow rate, and so on.

2. Description of the Related Art

FIG. 3 shows the structure of one conventional capacitance-type electrostatic servo acceleration sensor. This acceleration sensor, generally indicated by reference numeral 500, comprises a capacitance-detecting portion 1, a switched capacitor circuit 53, a pulse-width modulation (PWM) circuit 60, a NOT circuit 61, and a low-pass filter 58. The capacitance-detecting portion 1 has a movable electrode 11 which is capable of being displaced according to the applied acceleration, and a pair of fixed electrodes 12a and 12b mounted on opposite sides of the movable electrode 11. The switched capacitor circuit 53 converts variations in the interelectrode capacitances C1 and C2 in the capacitance-detecting portion 1 into an output voltage Vsc. The pulse-width modulation circuit 60 feeds a servo signal Vsw back to the fixed electrode 12a, the servo signal Vsw being pulse width-modulated according to the output voltage Vsc from the capacitor circuit 53. The NOT circuit 61 inverts the servo signal Vsw to form a servo signal notVsw and supplies this servo signal notVsw back to the fixed electrode 12b. The low-pass filter 58 extracts only low-frequency components of the servo signal Vsw and produces an output signal Vo.

The aforementioned capacitance-type electrostatic servo acceleration sensor 500 operates in the manner described below. When the movable electrode 11 is located midway between the fixed electrodes 12a and 12b, the interelectrode capacitance C1 is equal to the interelectrode capacitance C2. The output voltage Vsc proportional to the capacitance difference (C1–C2) is zero. At this time, the duty factor of the servo signals Vsw and notVsw is 50%, as indicated by the solid line in FIG. 4. Therefore, the electrostatic force that the movable electrode 11 receives from the fixed electrodes 12a and 12b when the servo signal Vsw assumes a level of +Vh is equal in magnitude but opposite in sense to the electrostatic force that the movable electrode 11 receives from the fixed electrodes 12a and 12b when the servo signal Vsw takes a level of 0. Since the frequency (e.g., 10 kHz) of the servo signals Vsw and notVsw is sufficiently higher than the response frequency (e.g., 200 Hz) of the movable electrode 11, the electrostatic force that the movable electrode 11 receives from the fixed electrodes 12a and 12b is accumulated and becomes zero. The movable electrode 11 is kept at rest at the midway location between the fixed electrodes 12a and 12b.

When an acceleration G is applied to the capacitance-detecting portion 1, inertia displaces the movable electrode 11. For example, the movable electrode 11 moves toward the fixed electrode 12a and away from the fixed electrode 12b. This increases the interelectrode capacitance C1 and reduces the interelectrode capacitance C2. Because of these capacitance variations, the output voltage Vsc proportional to the capacitance difference (C1–C2) assumes a value of +E. Correspondingly, as indicated by the dotted line in FIG. 4, the duty factor of the servo signals Vsw and notVsw becomes greater than 50%. Therefore, the electrostatic force that the movable electrode 11 receives from the fixed electrodes 12a and 12b when the servo signal Vsw is at a level of +Vh is different in magnitude from the electrostatic force that the movable electrode 11 receives from the fixed electrodes 12a and 12b when the servo signal Vsw is at a level of 0. These two forces are opposite to each other in sense. The electrostatic force that the movable electrode 11 receives from the fixed electrodes 12a and 12b is accumulated and becomes nonzero. As a result, the movable electrode 11 is repelled by the fixed electrode 12a and attracted towards the fixed electrode 12b. That is, the movable electrode 11 undergoes a force directed oppositely to the direction of displacement. Hence, the movable electrode 11 is returned into the midway point between the fixed electrodes 12a and 12b. Apparently, the movable electrode 11 is hardly displaced. When the acceleration G is applied, the duty factor of the servo signal Vsw changes accordingly as described above. By converting this signal into a dc signal by the low-pass filter 58, the output signal Vo corresponding to the acceleration G is obtained. The conventional capacitance-type electrostatic servo acceleration sensor described above is disclosed, for example, in Japanese Patent Laid-Open No. 337468/1992.

Since the above-described conventional capacitance-type electrostatic servo acceleration sensor 500 performs pulse-width modulation in proportion to the acceleration G, the pulse-width modulation circuit 60 needs an accurate oscillator to enhance the accuracy. This complicates the circuit configuration and increases the cost.

Furthermore, the servo signals Vsw and notVsw are invariably fed back to the fixed electrodes 12a and 12b to constrain the movable electrode 11 by means of the servo-mechanism. Consequently, it is difficult to detect capacitance variations with high sensitivity. That is, it is difficult to detect the acceleration G with high sensitivity.

Moreover, if the offset voltage of an operational amplifier incorporated in the switched capacitor circuit 53 drifts, the potential at the movable electrode 11 varies. The result is that the output voltage Vo contains an error.

SUMMARY OF THE INVENTION

It is an object of the present invention to provide a capacitance-type electrostatic servo acceleration sensor which does not need any accurate oscillator.

It is another object of the invention to provide a capacitance-type electrostatic servo acceleration sensor capable of detecting acceleration with high sensitivity.

It is a further object of the invention to provide a capacitance-type electrostatic servo acceleration sensor which can reduce error produced by drift of the offset voltage of the incorporated operational amplifier.

According to a first aspect of the invention, a capacitance-type electrostatic servo acceleration sensor comprises a capacitance-detecting portion, a switched capacitor circuit, a comparator, a feedback circuit, and an output signal-generating circuit. The capacitance-detecting portion has a movable electrode which can be displaced according to the applied acceleration and a pair of fixed electrodes located on opposite sides of the movable electrode. The switched capacitor circuit converts variations in capacitances in the capacitance-detecting portion into an output voltage. The comparator produces an output voltage so that the difference between the output voltage from the switched capacitor circuit and a given reference voltage becomes 0. The feedback circuit feeds respective servo signals back to the fixed electrodes of the capacitance-detecting portion, the servo signals being pulse amplitude-modulated according to the output voltage from the comparator. The output signal-generating circuit produces an output signal according to the output voltage from the switched capacitor circuit. The comparator comprises an operational amplifier having an inverting input terminal to which the output voltage from the switched capacitor circuit is applied. The operational amplifier further includes a non-inverting input terminal to which the reference voltage is applied. A feedback circuit is connected between the inverting input terminal and the output terminal of the operational amplifier. The electrically obtained open gain of the operational amplifier is set sufficiently larger than the mechanically obtained gain of the capacitance-detecting portion.

According to a second aspect of the invention, a capacitance-type electrostatic servo acceleration sensor comprises a capacitance-detecting portion, a switched capacitor circuit for converting changes in capacitances in the capacitance-detecting portion into an output voltage, a sample-and-hold amplifier for sampling and holding the output voltage from the switched capacitor circuit only during a measurement mode period, a comparator, a feedback circuit, and an output signal-generating circuit. The capacitance-detecting portion has a movable electrode which can be displaced according to the applied acceleration and a pair of fixed electrodes located on opposite sides of the movable electrode. The comparator produces an output voltage so that the difference between the output voltage from the sample-and-hold amplifier and a given reference voltage becomes 0. The feedback circuit feeds respective servo signals back to the fixed electrodes of the capacitance-detecting portion only during a force-balanced mode period, the servo signals being pulse amplitude-modulated according to the output voltage from the comparator. The output voltage generates an output signal according to the output voltage from the sample-and-hold amplifier. The measurement mode period and the force-balanced mode period are repeated alternately and periodically.

A third aspect of the present invention is based on the second aspect of the capacitance-type electrostatic servo acceleration sensor, and is characterized in that the comparator comprises an operational amplifier having an inverting input terminal, a non-inverting terminal, and an output terminal. The output voltage from the switched capacitor circuit is applied to the inverting input terminal. The reference voltage is applied to the non-inverting input terminal. The feedback circuit is connected between the inverting input terminal and the output terminal. The electrically obtained open gain of the operational amplifier is set sufficiently larger than the mechanically obtained gain of the capacitance-detecting portion.

A fourth aspect of the present invention is related to either the second or third aspect described above, and is characterized in that there is further provided a shorting switch circuit for short-circuiting the movable electrode to circuit ground or to a constant-voltage source only during the force-balanced mode period.

According to the first aspect of the capacitance-type electrostatic servo acceleration sensor, pulse-amplitude modulation is performed in proportion to the acceleration. The electrically obtained open gain of the operational amplifier is set sufficiently larger than the mechanically obtained gain of the capacitance-detecting portion. Therefore, a PWM circuit which needs an accurate oscillator is dispensed with. Consequently, the circuit configuration can be rendered simpler. Also, cost reductions can be accomplished.

The second aspect of the capacitance-type electrostatic servo acceleration sensor also makes use of pulse-amplitude modulation. In particular, pulse amplitude is modulated in proportion to the acceleration. The measurement mode period and the force-balanced mode period are repeated alternately and periodically. During the measurement mode period, servo signals are not fed back to the fixed electrodes. Variations in the capacitances in the capacitance-detecting portion are detected while the movable electrode is not constrained. The output voltage from the switched capacitor circuit is applied to the sample-and-hold amplifier. During the force-balanced mode period, the servo signals which are pulse amplitude-modulated according to the output voltage from the sample-and-hold amplifier are fed back to the fixed electrodes, respectively. The movable electrode is returned to the midway point between them electrodes.

The utilization of the pulse amplitude-modulation dispenses with a PWM circuit that needs an accurate oscillator. This leads to a simplification of the circuit configuration and a reduction in the cost. During measurement, the servo-mechanism does not constrain the movable electrode. Hence, variations in the capacitances can be detected with high sensitivity. That is, the acceleration can be detected with high sensitivity. When measurement is not performed, the movable electrode is constrained by the servomechanism. In consequence, the movable electrode is prevented from being displaced in vain; otherwise the movable electrode would get fatigued prematurely.

The third aspect of the capacitance-type electrostatic servo acceleration sensor is based on the second aspect of capacitance-type electrostatic servo acceleration sensor and is characterized in that the electrically obtained open gain of the operational amplifier is set sufficiently larger than the mechanically obtained gain of the capacitance-detecting portion. This makes it unnecessary to use a PWM circuit which requires an accurate oscillator. The circuit configuration can be simplified, and cost savings can be attained.

According to the fourth aspect of the capacitance-type electrostatic servo acceleration sensor, the movable electrode is short-circuited to circuit ground or to the constant-voltage source by the shorting switch circuit during the force-balanced mode period. Therefore, the offset voltage of the operational amplifier incorporated in the switched capacitor circuit does not affect the potential at the movable electrode. If the offset voltage drifts, the output signal produces no error. Hence, the output signal is stable against time and temperature.

Other objects and features of the invention will appear in the course of the description thereof, which follows.

DETAILED DESCRIPTION OF AN EMBODIMENT OF THE INVENTION

Figure 1:
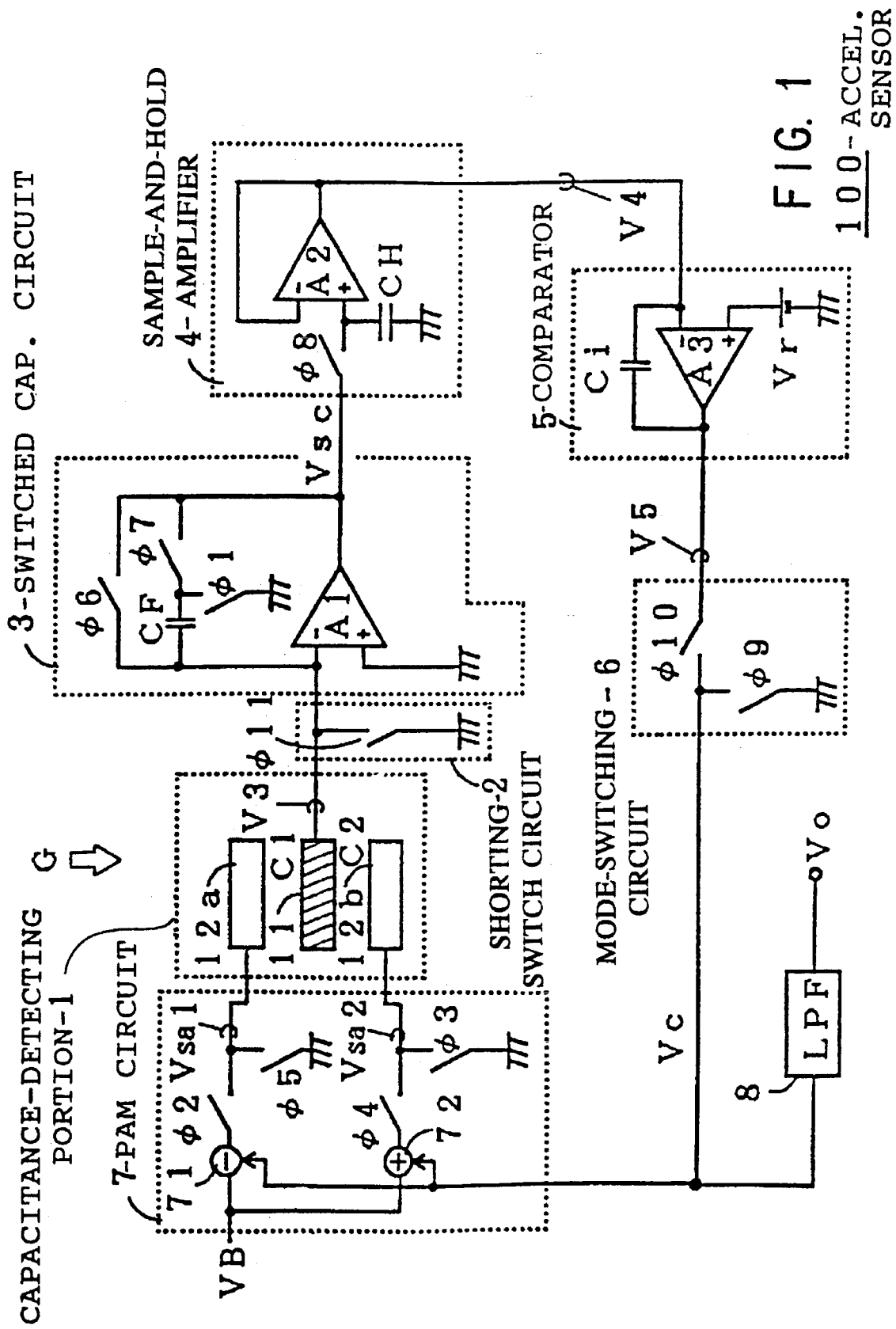
FIG. 1 is a circuit diagram of a capacitance-type electrostatic servo acceleration sensor according to an embodiment of the present invention.

Referring to FIG. 1, there is shown a capacitance-type electrostatic servo acceleration sensor according to an embodiment of the present invention. This acceleration sensor, generally indicated by reference numeral 100, comprises a capacitance-detecting portion 1, a shorting switch circuit 2, a switched capacitor circuit 3, a sample-and-hold amplifier 4, a comparator 5, a mode-switching circuit 6, a PAM (pulse-amplitude modulation) circuit 7, and a low-pass filter 8.

The capacitance-detecting portion 1 has a movable electrode 11 and fixed electrodes 12a and 12b located on opposite sides of the movable electrode 11. This movable electrode 11 is spaced a given distance from the fixed electrodes 12a and 12b and displaced in response to the applied acceleration G. The initial capacitance between the movable electrode 11 and the fixed electrode 12a is indicated by C1. The initial capacitance between the movable electrode 11 and the fixed electrode 12b is indicated by C2.

Figure 2:
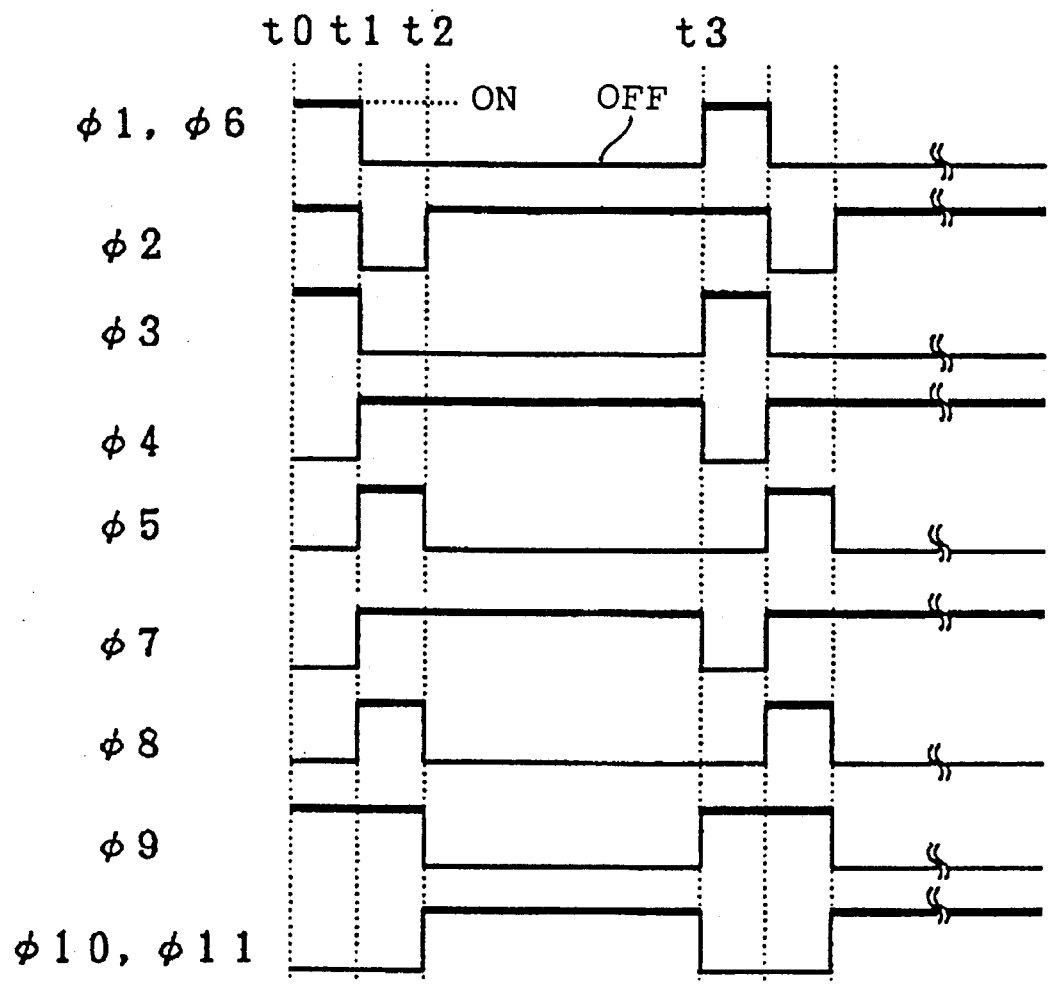
FIG. 2 is a time chart illustrating the operation of switches used in the acceleration sensor shown in FIG. 1.
Figure 3:
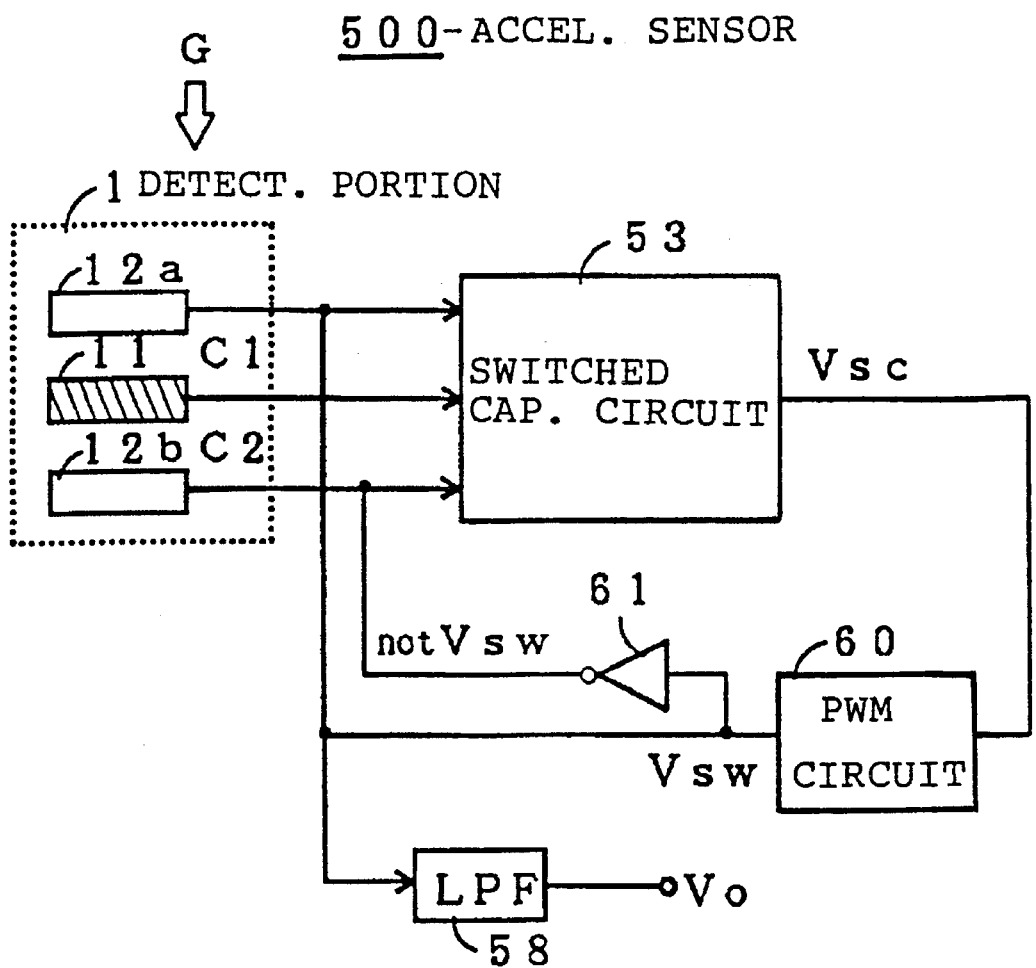
FIG. 3 is a circuit diagram of a conventional capacitance-type electrostatic servo acceleration sensor.
Figure 4:
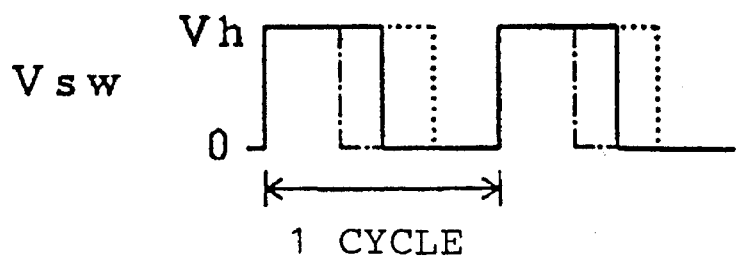
FIG. 4 is a waveform diagram of servo signals used in the conventional acceleration sensor shown in FIG. 3.

The shorting switch circuit 2 has a switch $\phi 11$ capable of short-circuiting the movable electrode 11 to circuit ground or to a constant-voltage source. As shown in FIG. 2, the switch $\phi 11$ is off during a measurement mode period Tm and is on during a force-balanced mode period Tf.

The switched capacitor circuit 3 is equipped with an operational amplifier A1 having an inverting input terminal connected with the movable electrode 11 and a non-inverting input terminal grounded. A switch $\phi 6$ is inserted between the inverting input terminal of the operational amplifier A1 and the output terminal. A capacitor CF and a switch $\phi 7$ are inserted between the inverting input terminal of the operational amplifier A1 and the output terminal and form a series circuit. The switched capacitor circuit 3 further includes a switch $\phi 1$ capable of grounding the junction of the capacitor CF and the switch $\phi 7$. As shown in FIG. 2, the switches $\phi 6$ and $\phi 1$ are on during the former half of the measurement mode period Tm and are off during the latter half of the measurement mode period Tm and during the force-balanced mode period Tf. The switch $\phi 7$ is off during the former half of the measurement mode period Tm and is on during the latter half of the measurement mode period Tm and during the force-balanced mode period Tf.

The sample-and-hold amplifier 4 has a voltage-follower operational amplifier A2. A switch $\phi 8$ is inserted between the non-inverting input terminal of the operational amplifier A2 and the output terminal of the operational amplifier A1 of the switched capacitor circuit 3. A hold capacitor CH is inserted between the non-inverting input terminal of the operational amplifier A2 and circuit ground. As shown in FIG. 2, the switch $\phi 8$ is on during the latter half of the measurement mode period Tm and is off during the former half of the measurement mode period Tm and during the force-balanced mode period Tf.

The comparator 5 is equipped with an operational amplifier A3 having an inverting input terminal connected with the output terminal of the operational amplifier A2 of the sample-and-hold amplifier 4 through a resistor Ri. The operational amplifier A3 further includes a non-inverting input terminal connected with a reference voltage source Vr which produces a reference potential when the position of the movable electrode 11 is constrained. For example, this reference potential may be fixed to 0 V. A capacitor Ci is inserted between the inverting input terminal of the operational amplifier A3 and the output terminal. The electrically obtained open gain of the operational amplifier A3 is sufficiently (more than 100 times) greater than the mechanically obtained gain of the capacitance-detecting portion.

The mode-switching circuit 6 has a switch $\phi 10$ whose input end is connected with the output terminal of the operational amplifier A3 of the comparator 5. A switch $\phi 9$ is inserted between the output end of the switch $\phi 10$ and circuit ground. As shown in FIG. 2, the switch $\phi 10$ is off during the measurement mode period Tm and is on during the force-balanced mode period Tf. The switch $\phi 9$ is on during the measurement mode period Tm and is off during the force-balanced mode period Tf.

The PAM circuit 7 has a subtractor 71 for producing the difference between a bias voltage VB and the voltage (feedback voltage Vc) at the output end of the switch $\phi 10$ of the mode-switching circuit 6. A switch $\phi 2$ is interposed between the subtractor 71 and the fixed electrode 12a. A switch $\phi 5$ is connected between the fixed electrode 12a and circuit ground. The PAM circuit 7 further includes an adder 72 for producing the sum of the bias voltage VB and the feedback voltage Vc. A switch $\phi 4$ is positioned between the adder 72 and the fixed electrode 12b. A switch $\phi 3$ is located between the fixed electrode 12b and circuit ground. As shown in FIG. 2, the switch $\phi 2$ is on during the former half of the measurement mode period Tm and during the force-balanced mode period Tf and is off during the latter half of the measurement mode period Tm. The switch $\phi 5$ is off during the former half of the measurement mode period Tm and during the force-balanced mode period Tf and is on during the latter half of the measurement mode period Tm. The switch $\phi 4$ is off during the former half of the measurement mode period Tm and is on during the latter half of the measurement mode period Tm and during the force-balanced mode period Tf. The switch $\phi 3$ is on during the former half of the measurement mode period Tm and is off during the latter half of the measurement mode period Tm and during the force-balanced mode period Tf.

The low-pass filter 8 extracts the low-frequency components of the feedback voltage Vc and produces an output signal Vo.

FIG. 2 is a time chart illustrating the operation of the switches $\phi 1$–$\phi 11$ which are turned on and off. This time chart is determined by pulses generated by an external logic circuit (not shown). The external logic circuit can have any configuration, as long as it provides the time chart of FIG. 2. In practice, a delay time is introduced between the leading and trailing edges of the pulses to prevent escape of electric charge through the switches. The escape of electric charge occurs when two or more switches are on at the same time, thereby overlapping. For simplicity of the diagram, this delay time is omitted. Instants of time t0–t1 define the former half of the measurement mode period. Instants of time t1–t2 define the latter half of the measurement mode period. Instants of time t2 and t3 define the force-balanced mode period. The period T of one cycle is 100 µs, for example. The measurement mode period Tm is 1 µs, for example. The force-balanced mode period Tf is 99 µs, for example.

The operation of this capacitance-type electrostatic servo acceleration sensor 100 is next described, with reference to the foregoing three defined time periods.

1) During the former half of the measurement mode period between instant t0 and instant t1:

The switch $\phi 10$ is off, whereas the switch $\phi 9$ is on. The feedback voltage Vc is 0. That is, no feedback is provided. The switch $\phi 2$ is on, while the switch $\phi 5$ is off. The servo signal Vsa1 to the fixed electrode 12a is as follows:

$$Vsa1 = VB - Vc = VB$$

On the other hand, he switch φ4 is off, and the switch φ3 is on. The servo signal Vsa2 to the fixed electrode 12b is as follows:

$$Vsa2=0$$

At this time, an electric charge Q1 is produced on the fixed electrode 12a. Let C1 be the initial capacitance. Let ΔC1 be the variation in the capacitance between the movable electrode 11 and the fixed electrode 12a due to the acceleration. The following relation holds:

$$Q1=(C1+\Delta C1) \times VB \quad (b\ 1)$$

Produced on the movable electrode 11 is an electric charge (−Q1) which is identical in magnitude but opposite in polarity to the charge Q1 on the fixed electrode 12a. This charge is supplied from the operational amplifier A1 through the switch φ6. No electric charge is induced on the fixed electrode 12b.

2) During the latter half of the measurement mode period between instant t1 and instant t2:

The switch 10 is off, while the switch φ9 is on. The feedback voltage Vc is 0. That is, no feedback is provided to constrain displacement of the movable electrode 11. The switch φ2 is off, while the switch φ5 is on. The servo signal Vsa1 to the fixed electrode 12a is given by:

$$Vsa1=0$$

Meanwhile, the switch φ4 is on, and the switch φ3 is off. The servo signal Vsa2 to the fixed electrode 12b satisfies the relationships:

$$Vsa2=VB+Vc=VB$$

Since the switch φ5 is on, the electric charge Q1 on the fixed electrode 12a given by Eq. (1) above is released and becomes zero. This upsets the balance in electric charge between the fixed electrode 12a and the movable electrode 11. The electric charge −Q1 on the movable electrode 11 flows to the left electrode of the capacitor CF.

Electric charge Q2 is produced on the fixed electrode 12b. Let C2 be the initial capacitance. Let ΔC2 be the variation in the capacitance between the movable electrode 11 and the fixed electrode 12b due to the acceleration. We have the relation $$Q2=(C2-\Delta C2) \times VB \quad (2)$$

Electric charge (−Q2) produced on the movable electrode 11 is equal in magnitude but opposite in polarity to the charge Q2 on the fixed electrode 12b. This electric charge is supplied from the operational amplifier A1 through the capacitor CF.

At this time, a new electric charge (+Q2) is induced on the left electrode of the capacitor CF to strike a balance in electric charge. In total, electric charge (−Q1+Q2) is produced on the left electrode of the capacitor CF. Therefore, electric charge (Q1−Q2) which is equal in magnitude but opposite in polarity to the charge produced on the left electrode is generated on the right electrode of the capacitor CF.

As a result, the output voltage Vsc produced from the operational amplifier A1 is given by $$Vsc=(Q1-Q2)/CF$$

Since the switch φ8 is on, the voltage Vch developed across the hold capacitor CH is $$Vch=(Q1-Q2)/CF$$

Accordingly, hold voltage V4 is given by $$V4=(Q1-Q2)/CF$$

This voltage is an output corresponding to the acceleration G. However, the switch φ10 is off. No feedback is yet provided to constrain displacement of the movable electrode 11.

Because of the potentials (VB, 0) at the fixed electrodes 12a and 12b, the movable electrode 11 receives an electrostatic force. However, the sense of the electrostatic force is reversed in going from the period t0–t1 to the period t1–t2. The period t0–t2 is very short compared with the response speed of the movable electrode 11. Therefore, it can be said that the movable electrode 11 is not substantially constrained by the electrostatic force.

3) During the force-balanced mode period between instant t2 and instant t3:

The switch φ8 is off. The states of the sample-and-hold amplifier 4 and comparator 5 are the same as the states assumed during the above-described measurement mode period. That is, the voltage V4 corresponding to the acceleration G is produced from the comparator.

The voltage V4 is compared with the reference voltage Vr by the comparator 5. This reference voltage Vr controls of the position of the movable electrode 11. Normally, the reference voltage Vr is fixed to 0 V. The comparator 5 produces a servo voltage V5 so as to cause the difference between the voltage V4 and the reference voltage Vr to decrease to zero.

Since the switch φ10 is on and the switch φ9 is off, the feedback voltage Vc passes through the mode-switching circuit 6 and is applied to the PAM circuit 7. In the PAM circuit 7, the switch φ2 is on, while the switch φ5 is off. Thus, the servo voltage Vsa1 to the fixed electrode 12a is given by $$Vsa1=VB-Vc$$

Because the switch φ4 is on and the switch φ3 is off, the servo voltage Vsa2=VB+Vc is applied to the fixed electrode 12b.

Since the switch φ11 is on, the potential V3 at the movable electrode 11 is 0 (V3=0). Accordingly, the movable electrode 11 receives from the fixed electrodes 12a and 12b an electrostatic force which corresponds to the acceleration G and is opposite in sense to the direction of displacement. In this way, the movable electrode 11 is returned to the position midway between the fixed electrodes 12a and 12b. That is, displacement is constrained. Generally, the generated electrostatic force is in proportion to the square of the applied voltage. Therefore, an electrostatic force proportional to the square of the servo signal Vsa1 is produced on the fixed electrode 12a. An electrostatic force proportional to the square of the servo signal Vsa2 is induced on the fixed electrode 12b. As a result, the movable electrode 11 is constrained in position by the servomechanism.

The low-pass filter 8 extracts the low-frequency components of the feedback voltage Vc and produces the output signal Vo. Since the low-frequency components of the feedback voltage Vc are variations (Q1−Q2)/CF in the acceleration G, the output signal Vo corresponding to the acceleration G is obtained.

In the capacitance-type electrostatic servo acceleration sensor 100 described thus far, the pulse amplitude is modulated in proportion to the acceleration. The electrically obtained open gain of the operational amplifier A3 forming the comparator 5 is set sufficiently larger than the mechanically obtained gain of the capacitance-detecting portion 1. This dispenses with a PWM circuit which necessitates an accurate oscillator. Hence, the circuit configuration can be simplified. Also, the cost can be curtailed.

During the measurement mode period Tm, the movable electrode 11 is not constrained by the servomechanism. Consequently, capacitance variations can be detected with high sensitivity. That is, the acceleration G can be detected with high sensitivity. On the other hand, during the force-balanced mode period Tf, the movable electrode 11 is constrained by the servomechanism. In consequence, the movable electrode 11 is prevented from being displaced in vain. This prevents the movable electrode 11 from getting fatigued prematurely.

During the force-balanced mode period Tf, the shorting switch circuit 2 short-circuits the movable electrode 11 to circuit ground or to the constant-voltage source. Therefore, the offset voltage Vos of the operational amplifier A1 of the switched capacitor circuit 3 does not affect the potential V3 at the movable electrode 11. If the offset voltage Vos drifts, the output voltage Vsc produces no error. Hence, the output signal Vo is stable against time and temperature.

In the capacitance-type electrostatic servo acceleration sensor 100 described above, the voltage feedback ratio of the servomechanism is in proportion to the duty factor of the servo signals Vsa1 and Vsa2. The voltage feedback ratio can be adjusted by varying the ratio of the measurement mode period Tm to the force-balanced mode period Tf. For example, if the ratio of the measurement mode period Tm to the force-balanced mode period Tf is 1:3, then the voltage feedback ratio is 75%. The voltage feedback ratio is determined, taking account of both an allowance given to the phase of the servosystem and required frequency characteristics of the acceleration sensor.

Since the novel capacitance-type electrostatic servo acceleration sensor utilizes PAM (pulse-amplitude modulation), a PWM circuit which needs an accurate oscillator is dispensed with. This simplifies the circuit configuration and reduces the cost. During measurement, the servomechanism does not constrain the movable electrode and so acceleration can be detected with high sensitivity. On the other hand, when no measurement is made, the servomechanism constrains the movable electrode. In consequence, the movable electrode is prevented from being displaced in vain. This prevents the movable electrode from getting fatigued prematurely. Furthermore, when no measurement is performed, the movable electrode is short-circuited to circuit ground or to the constant-voltage source. Therefore, if the offset voltage of the operational amplifier of the switched capacitor circuit drifts because of temperature variations or for another cause, the output signal produces no error.

Although the present invention has been described in relation to a particular embodiment thereof, many other variations and modifications and other uses will become apparent to those skilled in the art. Therefore, the present invention is not limited by the specific disclosure herein.

What is claimed is:

1. A capacitance-type electrostatic servo acceleration sensor comprising:

a capacitance-detecting portion having a movable electrode and a pair of fixed electrodes located on opposite sides of said movable electrode, said movable electrode being capable of being displaced in response to an acceleration;

a switched capacitor circuit for converting variations in capacitances in said capacitance-detecting portion into an output voltage;

a comparator for producing a comparator output voltage so that a difference between said output voltage from said switched capacitor circuit and a given reference voltage becomes 0;

a feedback circuit for feeding servo signals back to said fixed electrodes, respectively, of said capacitance-detecting portion, said servo signals being pulse amplitude-modulated according to said comparator output voltage;

an output signal-generating circuit for generating an output signal according to said output voltage from said switched capacitor circuit;

wherein an operational amplifier forms said comparator and has an inverting input terminal to which said output voltage from said switched capacitor circuit is applied, a non-inverting input terminal to which said reference voltage is applied, and an output terminal, said operational amplifier having an open gain and a voltage feedback ratio; and a feedback circuit connected between said inverting input terminal and said output terminal of said operational amplifier, said feedback circuit providing said voltage feedback ratio so that said electrically obtained open gain is sufficiently greater than a mechanically obtained gain of the capacitance-detecting portion.

2. A capacitance-type electrostatic servo acceleration sensor comprising:

a capacitance-detecting portion having a movable electrode and a pair of fixed electrodes located on opposite sides of said movable electrode, said movable electrode being capable of being displaced in response to an acceleration;

a switched capacitor circuit for converting variations in capacitances in said capacitance-detecting portion into an output voltage;

a sample-and-hold amplifier for sampling and holding said output voltage from said switched capacitor circuit only during a measurement mode period;

a comparator for producing a comparator output voltage so that a difference between an output voltage from said sample-and-hold amplifier and a given reference voltage becomes 0;

a feedback circuit for feeding servo signals back to said fixed electrodes, respectively, of said capacitance-detecting portion only during a force-balanced mode period, said servo signals being pulse amplitude-modulated according to said comparator output voltage;

an output signal-generating circuit for generating an output signal according to an output voltage from said sample-and-hold amplifier; and said switched capacitor circuit, said sample-and-hold amplifier, said comparator, said feedback circuit and said output signal-generating circuit having control switches which are controllable for repeating said measurement mode period and said force-balanced mode period alternately and periodically.

3. The capacitance-type electrostatic servo acceleration sensor of claim 2, further comprising a shorting switch circuit for short-circuiting said movable electrode to circuit ground or to a constant-voltage source only during said force-balanced mode period.

4. The capacitance-type electrostatic servo acceleration sensor of claim 2, wherein said feedback circuit comprises a mode-switching circuit which alternately passes said comparator output voltage to a pulse amplitude modulator circuit for pulse amplitude-modulating said servo signals.

5. The capacitance-type electrostatic servo acceleration sensor of claim 2, wherein said comparator comprises an operational amplifier having an inverting input terminal to which said output voltage from said switched capacitor circuit is applied, a non-inverting input terminal to which said reference voltage is applied, and an output terminal, said comparator having a feedback circuit connected between said inverting input terminal and said output terminal of said operational amplifier, said operational amplifier having an electrically obtained open gain, and wherein said feedback circuit provides said open gain which is sufficiently greater than a mechanically obtained gain of the capacitance-detecting portion.

6. The capacitance-type electrostatic servo acceleration sensor of claim 5, further comprising a shorting switch circuit for short-circuiting said movable electrode to circuit ground or to a constant-voltage source only during said force-balanced mode period.

7. The capacitance-type electrostatic servo acceleration sensor of claim 5, wherein said feedback circuit comprises a mode-switching circuit which alternately passes said comparator output voltage to a pulse amplitude modulator circuit for pulse amplitude-modulating said servo signals.

* * * * *